United States Patent
Vogel et al.

(10) Patent No.: US 7,155,711 B2
(45) Date of Patent: Dec. 26, 2006

(54) METHOD AND APPARATUS PROVIDING REMOTE REPROGRAMMING OF PROGRAMMABLE LOGIC DEVICES USING EMBEDDED JTAG PHYSICAL LAYER AND PROTOCOL

(75) Inventors: Stephen R. Vogel, Medford, NJ (US); Steven Jeffrey Zack, Burlington, NJ (US)

(73) Assignee: Sedna Patent Services, LLC, Philadelphia, PA (US)

( * ) Notice: Subject to any disclaimer, the term of this patent is extended or adjusted under 35 U.S.C. 154(b) by 774 days.

(21) Appl. No.: 09/733,402

(22) Filed: Dec. 8, 2000

(65) Prior Publication Data

US 2002/0070753 A1  Jun. 13, 2002

Related U.S. Application Data

(60) Provisional application No. 60/170,199, filed on Dec. 10, 1999.

(51) Int. Cl.
*G06F 9/44* (2006.01)
*G06F 17/50* (2006.01)

(52) U.S. Cl. ............ 717/169; 717/171; 717/173; 326/37; 326/38; 326/39; 716/16

(58) Field of Classification Search ........... 717/139, 717/168–178, 128; 700/2; 709/217, 216, 709/221; 326/37–39, 45; 716/16, 17, 3; 710/51; 703/21, 27; 719/327; 714/725; 370/360
See application file for complete search history.

(56) References Cited

U.S. PATENT DOCUMENTS

| | | | | |
|---|---|---|---|---|
| 5,237,218 A | * | 8/1993 | Josephson et al. | 326/38 |
| 5,338,982 A | * | 8/1994 | Kawana | 326/45 |
| 5,452,227 A | * | 9/1995 | Kelsey et al. | 716/3 |
| 5,493,239 A | * | 2/1996 | Zlotnick | 326/38 |
| 5,635,855 A | * | 6/1997 | Tang | 326/38 |
| 5,717,928 A | * | 2/1998 | Campmas et al. | 716/17 |
| 5,796,750 A | * | 8/1998 | Lottridge et al. | 714/725 |
| 5,815,405 A | * | 9/1998 | Baxter | 716/3 |
| 5,864,486 A | * | 1/1999 | Deming et al. | 716/17 |
| 5,881,236 A | * | 3/1999 | Dickey | 709/221 |
| 5,889,775 A | * | 3/1999 | Sawicz et al. | 370/360 |
| 5,892,683 A | * | 4/1999 | Sung | 703/27 |
| 5,949,983 A | * | 9/1999 | Baxter | 716/6 |
| 6,071,317 A | * | 6/2000 | Nagel | 717/128 |

(Continued)

OTHER PUBLICATIONS

Altera Corporation, Altera Corporation, May 1999, Altera Corporation, ver. 6, p. 1-20.*

(Continued)

*Primary Examiner*—Wei Zhen
*Assistant Examiner*—Satish S. Rampuria
(74) *Attorney, Agent, or Firm*—Patterson & Sheridan, LLP

(57) ABSTRACT

An apparatus and method for programming a remote programmable logic device. The apparatus comprises a processing system having a first file to second file conversion program stored therein. The processing system receives the first file from a first communications medium and transmits the converted second file through a second communications medium in a format native to the remote programmable logic device. The method comprises sending a first file to a processing system via a first communications medium, converting the first file to a second file in a format native to the remote programmable logic device, and sending the second file in a format native to the remote programmable logic device to the remote programmable logic device via a second communications medium.

18 Claims, 5 Drawing Sheets

U.S. PATENT DOCUMENTS

| | | | | |
|---|---|---|---|---|
| 6,078,735 | A | * | 6/2000 | Baxter .......................... 716/3 |
| 6,134,707 | A | * | 10/2000 | Herrmann et al. .......... 717/139 |
| 6,144,933 | A | * | 11/2000 | Guccione .................... 703/23 |
| 6,166,730 | A | | 12/2000 | Goode et al. ............... 345/327 |
| 6,198,304 | B1 | * | 3/2001 | Sasaki ......................... 326/39 |
| 6,255,849 | B1 | * | 7/2001 | Mohan ........................ 326/41 |
| 6,381,741 | B1 | * | 4/2002 | Shaw ......................... 717/168 |
| 6,389,321 | B1 | * | 5/2002 | Tang et al. .................... 700/2 |
| 6,425,125 | B1 | * | 7/2002 | Fries et al. ................. 717/168 |
| 6,496,969 | B1 | * | 12/2002 | Roy et al. .................... 716/12 |
| 6,535,911 | B1 | * | 3/2003 | Miller et al. ................ 709/217 |
| 6,578,198 | B1 | * | 6/2003 | Freeman et al. ............ 717/168 |
| 6,675,201 | B1 | * | 1/2004 | Parkkinen ................... 709/216 |
| 6,718,407 | B1 | * | 4/2004 | Martwick ..................... 710/51 |
| 6,832,379 | B1 | * | 12/2004 | Zeryck et al. .............. 719/327 |
| 2003/0163298 | A1 | * | 8/2003 | Odom et al. .................. 703/21 |

OTHER PUBLICATIONS

Bill Ewing, EDN Design Feature, Nov. 20, 1997, EDN Design Feature, p. 78-92.*

Brain Dipert, EDN Design Feature, Nov. 20, 1997, EDN Design Feature, p. 77.*

Steve Stark, Lattice Semiconductor: Lattice introduces isp VM EMBEDDED; Indusry's first embedded, mlti-vendor, single-chain in-system programming tool, Sep. 26, 2000, M2 Presswire, p. 1.*

Business Editors and Computer Writers, Java Applets Empower Internet Reconfigurable Logic; Java technology now delivers both software and hardware via the web, Nov. 10, 1998, Business Wire, p. 1.*

Michael Santarimi, Fast spin to ASICs is goal, Jul. 13, 1998, Design Automation, p. 44.*

Altera, Remote system upgrades with stratix II FPGAs, Altera.*

Kawana et al., An efficient logic block interconnect architecture for user-reprogrammable gate array, IEEE, May 1990, pp. 31.3/1-31.3/4.*

Arabi et al., PLD integrates dedicated high-speed data buffering, complex state machine, and fast decode array, IEEE, Sep. 1993, pp. 432-436.*

Yinlei et al., A diagnosis method for interconnects in SRAM based FPGAs, IEEE, Dec. 1998, pp. 278-282.*

U.S. Appl. No. 09/363,670, filed Jul. 29, 1999, entitled: Tightly-Coupled Disk-to-CPU Storage Server.

U.S. Appl. No. 09/540,178, filed Mar. 31, 2000, entitled: Method and Apparatus of Load Sharing and Improving Fault Tolerance in an Interactive Video Distribution System.

\* cited by examiner

METHOD AND APPARATUS PROVIDING REMOTE REPROGRAMMING OF PROGRAMMABLE LOGIC DEVICES USING EMBEDDED JTAG PHYSICAL LAYER AND PROTOCOL

CROSS REFERENCE

This application claims benefit of U.S. Provisional Application Ser. No. 60/170,199,filed Dec. 10, 1999,which is hereby incorporated by reference in its entirety.

BACKGROUND OF THE DISCLOSURE

Programmable logic devices (PLDs), such as field programmable gate arrays (FPGAs) and the like, are well known. A programmable logic device comprises a complex logical element that may be programmed to effect combinational logic, sequential logic, or combined combination and sequential logic functions. Thus, a PLD allows for software modifications of sequential and/or combinational logic in a physical layer. In this manner, bug fixes, feature enhancements, and other improvements to systems incorporating PLDs may be provided via software update.

PLDs are typically updated by sending a service technician to the physical location of the PLD. The service technician will replace a programmable read-only memory (PROM) on a board or circuit including the PLD to be reprogrammed. Alternatively, an electrically programmable read-only memory (EPROM) may be reprogrammed in the standard manner by downloading new firmware from a personal computer (PC) and using a special program adapter supplied by the manufacturer of the PLD. In either case, the board, circuit, or system incorporating the PLD to be reprogrammed is taken out of operation and serviced by an on-site technician.

Therefore, it is deemed to be desirable to provide a method and apparatus for remotely programming a PLD or FPGA such that on-site visits by a service technician are not required.

SUMMARY OF THE INVENTION

The disadvantages associated with the prior art are overcome by the present invention of an apparatus and method for programming a remote programmable logic device. In a first embodiment, the apparatus comprises a processing system having a first file to second file conversion program stored therein. The processing system receives the first file from a first communications medium and transmits the converted second file through a second communications medium in a format native to the remote programmable logic device.

Furthermore, a method corresponding to the first embodiment comprises receiving, via a first communications medium, a first file including programmable logic instructions in a non-native format, and converting the non-native format programmable logic instructions into programmable logic instructions having a format native to the remote programmable logic device. Thereafter, transmitting to the remote programmable logic device, via a second communications medium, a second file including the native format programmable logic instructions.

In a second embodiment, the apparatus for programming at least one programmable logic devices comprises at least one circuit board respectively comprising the at least one programmable logic device coupled to at least one switching circuit. A processor system is coupled to the at least one switching circuit via a board select bus and a JTAG bus, wherein the processor system executes a file in a format native to the at least one programmable logic device. The native format file enables the at least one switching circuit via the board select bus, and then programs the at least one programmable logic device via the JTAG bus.

Furthermore, a method corresponding to the second embodiment comprises receiving at a head-end controller via a first communications medium, a file having a format native to the at least one programmable logic device. The native format file is sent to a processor system via a second communications medium. The processor system executes the native format file to identify and selectively access the at least one programmable logic devices via the board select bus. The selectively accessed programmable logic devices are then programmed via the JTAG bus.

BRIEF DESCRIPTION OF DRAWINGS

The teachings of the present invention can be readily understood by considering the following detailed description in conjunction with the accompanying drawings, in which.

DESCRIPTION OF THE EMBODIMENT

Figure 1:
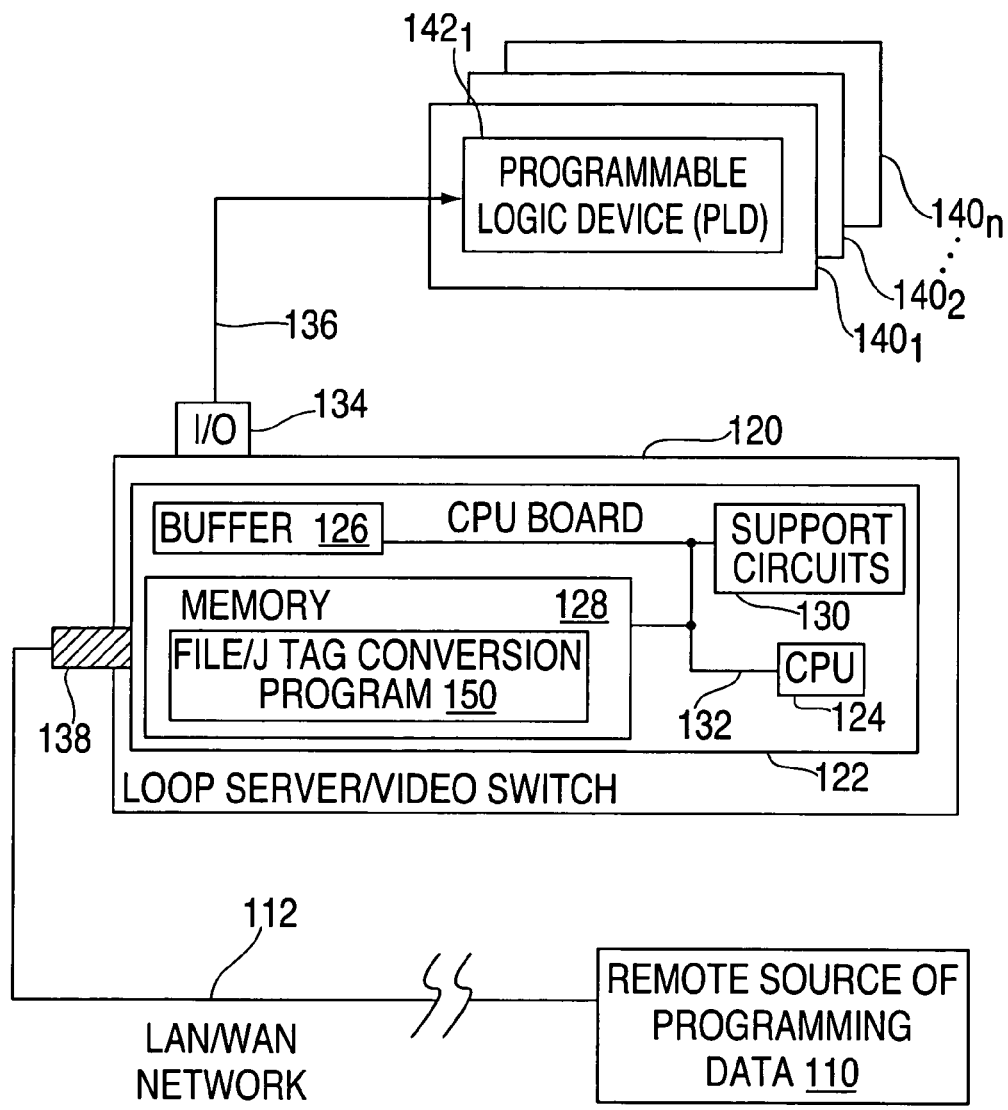
FIG. 1 depicts first embodiment of a high-level block diagram of an information processing system including apparatus according to the invention.

FIG. 1 depicts a high-level block diagram of an information processing system including apparatus according to the invention. Specifically, FIG. 1 depicts an information processing system 100 comprising a remote source of programming data 110, a processing system 120 such as a loop server (or video switch), and a remote programmable logic device 142 such as a gate array, field programmable gate array, field programmable logic array, read only memory, programmed array logic, programmable logic array, complex programmable logic devices, and the like. The remote source of programming data 110 is illustratively a remotely located computer workstation, which communicates with the loop server or video switch 120 via the LAN/WAN connection 112.

Figure 2:
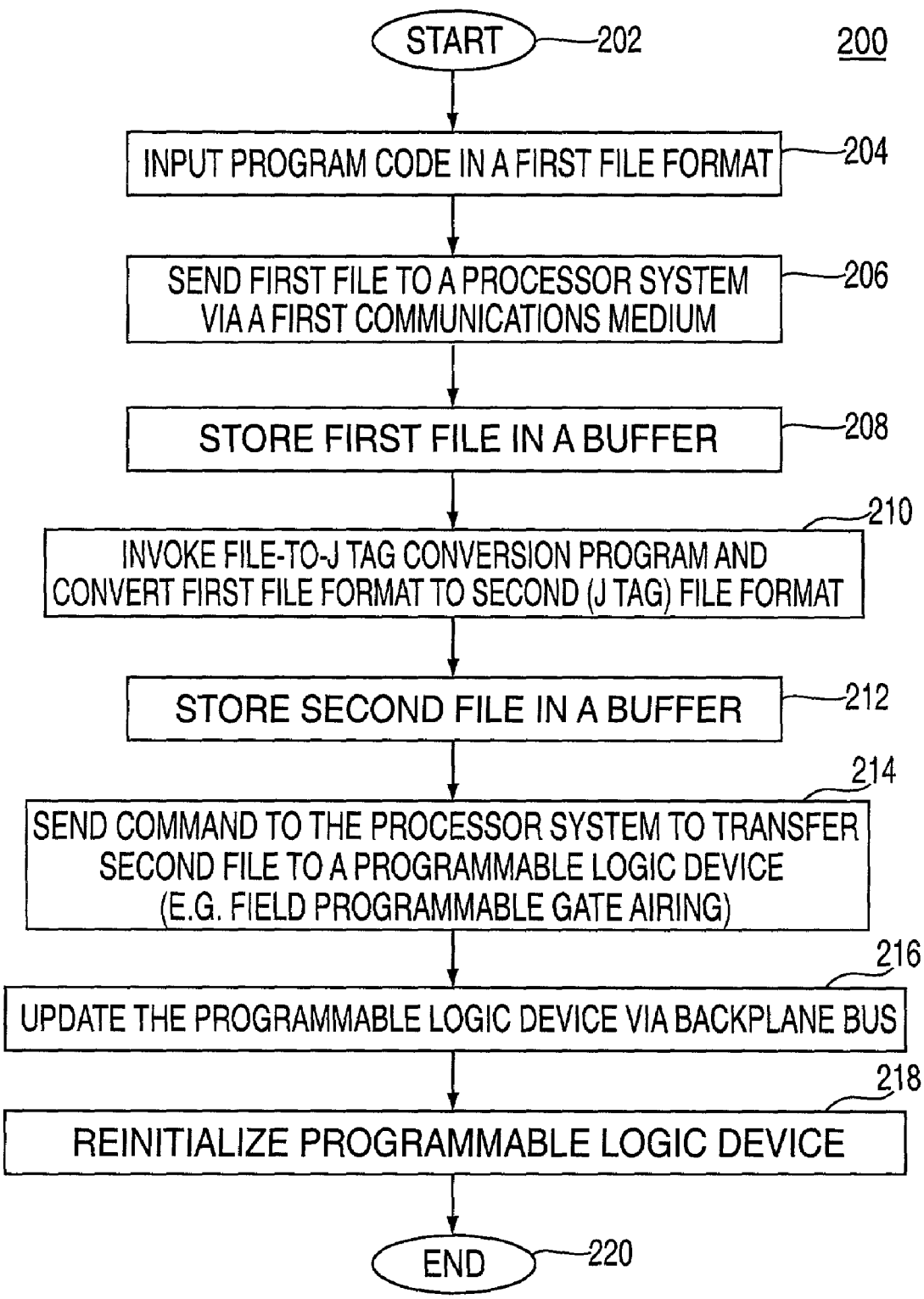
FIG. 2 depicts a flow diagram of a first method for programming a remote programmable logic device according to the invention of FIG. 1.

The processor system 120 includes a processor board 122 and an Ethernet port 138. The Ethernet port 138 is in communication with the remote source of programming data 110, such as a computer workstation or personal computer, via a network 112, such as local area network (LAN) or wide area network (WAN) denoted as LAN/WAN 112, and illustratively an Ethernet link. Furthermore, the processor board 122 comprises various components coupled to a bus 132 including at least one processor (e.g., a CPU) 124, a buffer 126, memory (e.g., RAM) 128, and support circuits 130. The memory 128 stores software (i.e. File/JTAG conversion program 150) for performing a file/JTAG conversion method 200 (FIG. 2).

One or more programmable logic devices (PLDs) such as field programmable gate arrays (FPGA's) $142_1$ (only one PLD shown) are located within one or more functional elements $140_1$ through $140_n$ (collectively function elements 140), such as one or more circuit boards of a system. A person skilled in the art will understand that other programmable logic devices such as a programmable read only memory (PROM), programmable logic array (PAL), and the like may also be utilized. In one embodiment, the processor board 122 is connected to a PLD host functional element $140_1$ via an input/output (I/O) port 134 such as a back plane or inter-board input/output (I/O) bus.

In an exemplary embodiment where the back plane 134 is utilized, the back plane 134 includes a plurality of signal paths 136. The signal paths 136 conform to the physical layer and other protocols provided in IEEE Standard 1149.1-1990, entitled "IEEE Standard Test Access Port and Boundary Scan Architecture," published May 21, 1990 by the Institute of Electrical & Electronic Engineers Inc. In this manner, the back plane or inter-board I/O bus provides the physical layer and protocol-compliant Joint Test Action Group (JTAG) interface.

Moreover, by utilizing the JTAG physical layer directly within the back plane of a multi-board or multi-module system, the number of pins within the back plane connections may be reduced. That is, rather than having discrete pins or electrical connections made to each of a plurality of boards, modules, or sub-systems including field programmable gate arrays, a single set of contacts or signal paths adhering to the physical layer and related protocols described in IEEE Standard 1149.1 may be used to effect reprogramming operations on each of the plurality of boards, modules, or sub-systems included within the system.

FIG. 2 depicts a flow diagram of a method 200 for programming one or more remote programmable logic devices 142 according to the invention. The method 200 begins in step 202 and proceeds to step 204 where a programmer or technician accesses the remote programming workstation 110 and inputs program code in a first file format native to the programming workstation 110. For example, the program code may be written in a program language such as microcode from ALTERA®, or the like. The program code may also be generated automatically according to a rules-based expert system in response to configuration changes or other system changes, upgrades, and the like.

In step 206, the program code is then sent, via the first communications medium (e.g., Ethernet network) 112, to the processor system 120, and in step 208, the first file is received by the processor board 122 where the first file is stored in the buffer 126. As such, the processor board 122 receives a data file in a predefined file format and stores the data file in the buffer 126.

In step 210, the CPU 124 on the processor board 122 invokes a file-to-JTAG conversion program 150, which converts the programming data from the first file format to a second file in a format native to the remote programmable logic device 142 within the host functional element 140. In particular, the CPU 124 retrieves the buffered first file and executes the file conversion software program 150. That is, the file-to-JTAG conversion program 150 converts the buffered data from the originally sent storage/transmission format to the JTAG programming format. For example, a field programmable gate array manufactured, illustratively by ALTERA Corporation of San Jose, Calif., provides programming code stored in a .POF file. The POF-to-JTAG conversion program 150 converts the buffered POF file from the originally sent storage/transmission format to the JTAG programming format. Thereafter, in step 212, the CPU stores the converted data in the buffer 126.

In step 214, a command is sent by the remote source of programming data 110 to the processor board 122. The command instructs the processor board 122 to send the converted JTAG format information to the PLD 142 within the host functional element 140. Specifically, the processor board 122 transfers the converted programming data from the buffer 126 as a second file, through the physical layer JTAG back plane 134 according to the protocol of the IEEE 1149.1 Standards document, and to the remotely located PLD 142.

In step 216, the PLD programming data that is transferred via the JTAG back plane connection 124 to the PLD, while the processor board 122 and PLD host functional element 140 are operational. In this manner, there is no need to remove the processor board 122, the loop server/video switch 120, the PLD 142, or the PLD host element 140 from service during the programming process. As such, the PLD 142 has been remotely updated with new programming information from the remote programming workstation 110.

In step 218, the PLD host functional element 140 being updated (i.e., board) is reinitiallized. The updated PLD 142 may be reinitialized via numerous techniques. In one technique, the host functional element 140 and corresponding PLD 142 cycled on and off. Powering down the board 142 being updated resets the PLD 142 so that the new configuration data within the PLD 142 can take effect after the PLD 142 is powered up again. Alternately, the host functional element 140 provides an initialization signal to the PGA via the JTAG bus such that the PGA responsibly adopts its logic configuration to the new code. Another method allows the processor 124 to provide an initialization signal to the PLD 142 via a separate communications path (not shown).

In step 218, the host functional element 140 and corresponding PLD 142 is reinitialized (e.g. power cycled) whereupon the PLD 142 begins performing the newly programmed function or functions.

The amount of time required for switching from on line to off line, and back on line is typically inconsequential to normal operation. Furthermore, the data may be buffered prior to processing by the PLD 142 while the PLD board 140 is quickly reset, whereupon the buffered data may be supplied to the PLD 142 for processing according to the new combination and/or sequential logic functions. In step 220, the method 200 ends.

Figure 3:
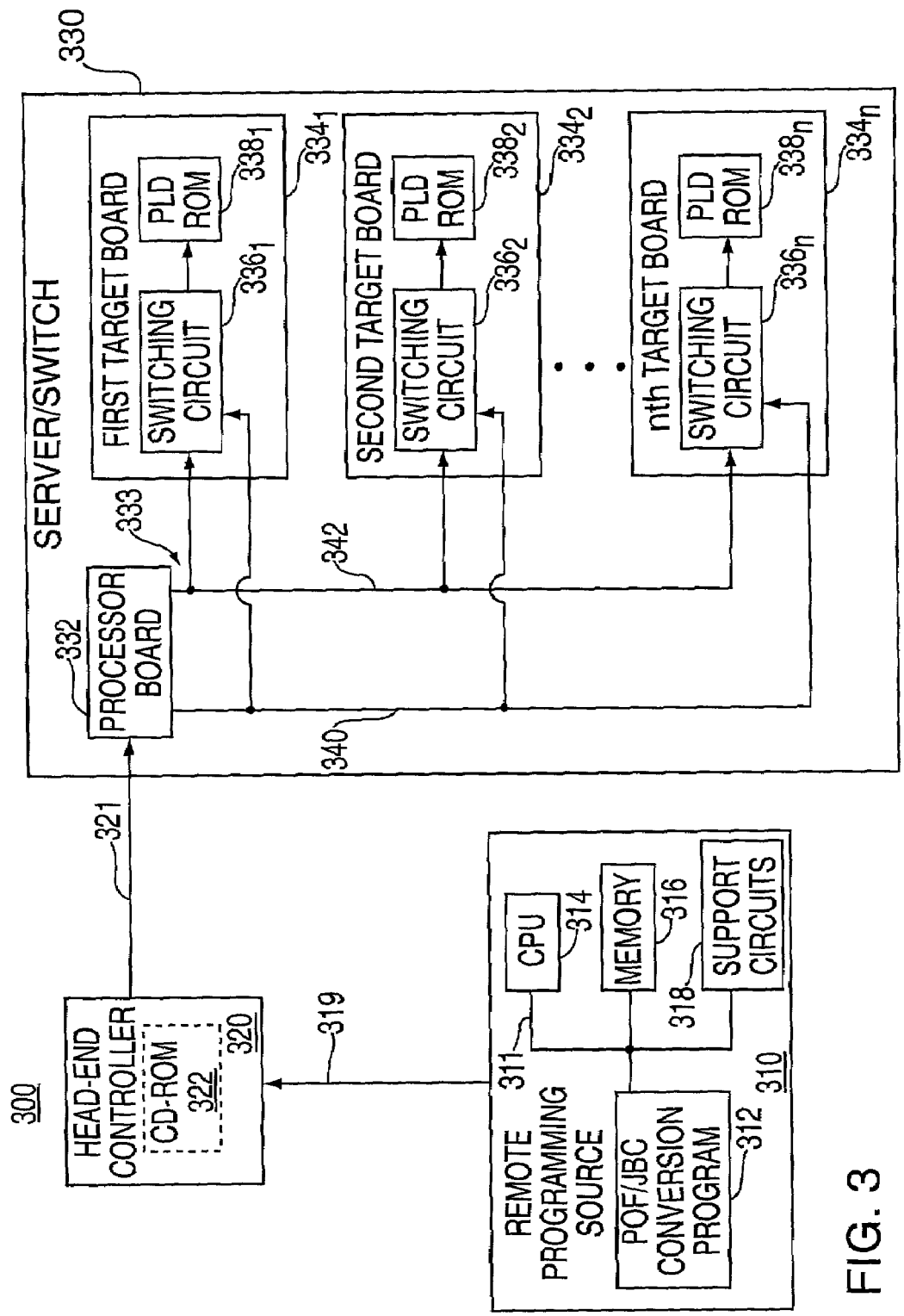
FIG. 3 depicts second embodiment of a high-level block diagram of the information processing system including apparatus according to the invention.

FIG. 3 depicts a high-level block diagram of an information processing system including apparatus according to an embodiment of the invention. Specifically, FIG. 3 depicts an interactive information distribution system 300 such as a video information distribution system. Such a system is described in more detail in U.S. Pat. No. 6,166,730, entitled "System For Interactively Distributing Information Services", which is incorporated herein by reference in its entirety as fully reproduced herein.

The information distribution system 300 of FIG. 3 comprises a remote source of programming data 310 coupled to a server (or video switch) 330 via a head-end controller (HEC) 320. A video switch suitable for use in the present invention is described in detail in U.S. patent application Ser. No. 09/540,178, entitled "Method And Apparatus Of Load Sharing And Improving Fault Tolerance In An Interactive Video Distribution System", filed Mar. 31, 2000, which is hereby incorporated herein by reference in its entirety as fully reproduced herein.

The remote programming source 310 is coupled to the HEC 320 via a first communications path 319, such as a telecommunications medium (e.g., LAN/WAN connection, Internet, or the like), or by a physical medium (e.g., CD-ROM 322, which is drawn in phantom). The head-end controller 320 is coupled to the server 330 via a second communications path 321 such as an Ethernet connection.

The remote programming source 310 comprises various components coupled to a bus 311 including at least one processor (e.g., a CPU) 314, memory (i.e., RAM) 316, and support circuits (e.g., I/O controllers, power supplies, and the like) 318. The memory 128 stores software 312 for performing a programmer object file (POF) to JAM byte code (JBC) conversion. The POF is a binary file created by a compiler (not shown). Furthermore, the JBC is a file containing a sequence of commands, which instructs a programmable device to perform a routine or procedure in a specific manner.

The head end controller 320 comprises one or more processors (not shown) for communicating information (e.g., video information, data, audio information, and the like) to a plurality of remote locations, such as a plurality of subscribers for video services. The head-end controller 320 is capable of receiving files such as the JBC files from the remote programming source 310. Specifically, the remote programming source 110 communicates with the head-end controller 320 via the first communications path 319.

The server/switch 330 comprises at least one processor 332 coupled to one or more circuit boards $334_1$ through $334_n$ (collectively circuit boards 334) each having a programmable logic device $338_1$ through $338_n$ (collectively programmable logic devices 338) such as a field programmable gate array (FPGA). A person skilled in the art will recognize that the circuit boards 334 may differ in functionality, configuration, manufacturer and the like from one another. Furthermore, different programmable logic devices may be utilized amongst the various circuit boards 334, such as gate arrays, field programmable logic arrays, read only memory, programmed array logic, programmable logic array, complex programmable logic devices, and the like.

In one embodiment each circuit board 334 is physically coupled to the at least one processor 332 via a backplane 333. The backplane 333 may be a compact PCI backplane having n slots (not shown) for receiving the one or more circuit boards 334. A backplane suitable for use in the present invention is described in detail in U.S. Pat. No. 6,289,376, entitled "Tightly-Coupled Disk-To-CPU Storage Server", which is hereby incorporated by reference herein as fully reproduced herein.

The processor 332 is electrically coupled to each circuit board 334 via board select bus 340 and a JTAG bus 342. In one embodiment, the board select bus 340 is a parallel bus, while the JTAG bus 342 is a serial bus.

Each circuit board 334 comprises circuitry including a PLD 338 and a corresponding switching circuit 336. The PLD 338 interacts with other circuitry (not shown) on the circuit card 334 to perform some function, task, or plurality of tasks. The board select bus 340 and JTAG bus 342 are coupled to inputs of the switching circuit 336 and provide input signals to the switching circuit 336. The switching circuit 336 comprises a plurality of discrete elements and/or logic gates that function as a switch to allow signals to pass from the JTAG bus through the switching circuit 336 to the PLD.

Figure 4A:
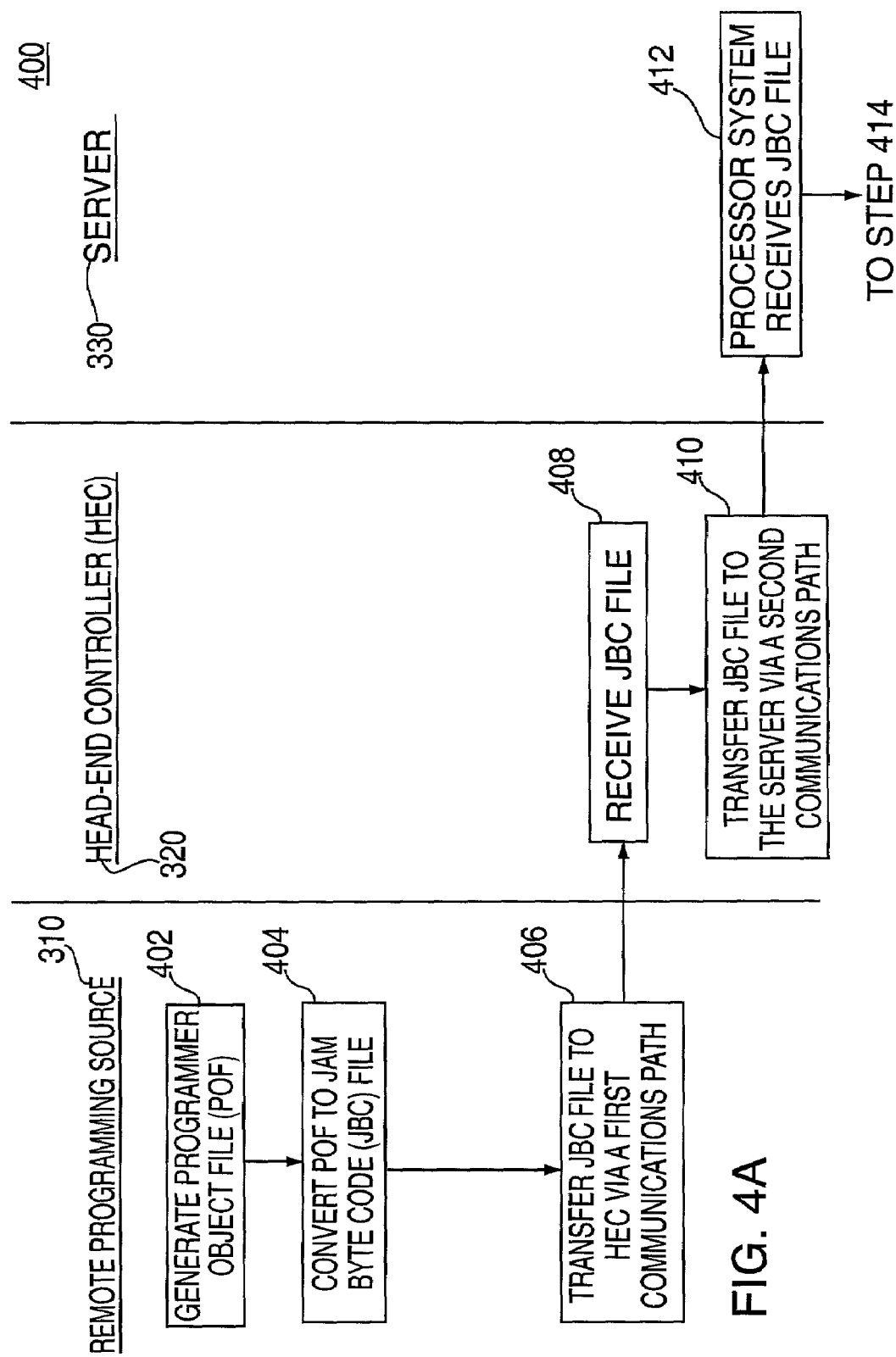
FIGS. 4A and 4B together depict a relational flow diagram between various functional elements of the information processing system of FIG. 3.
Figure 4B:
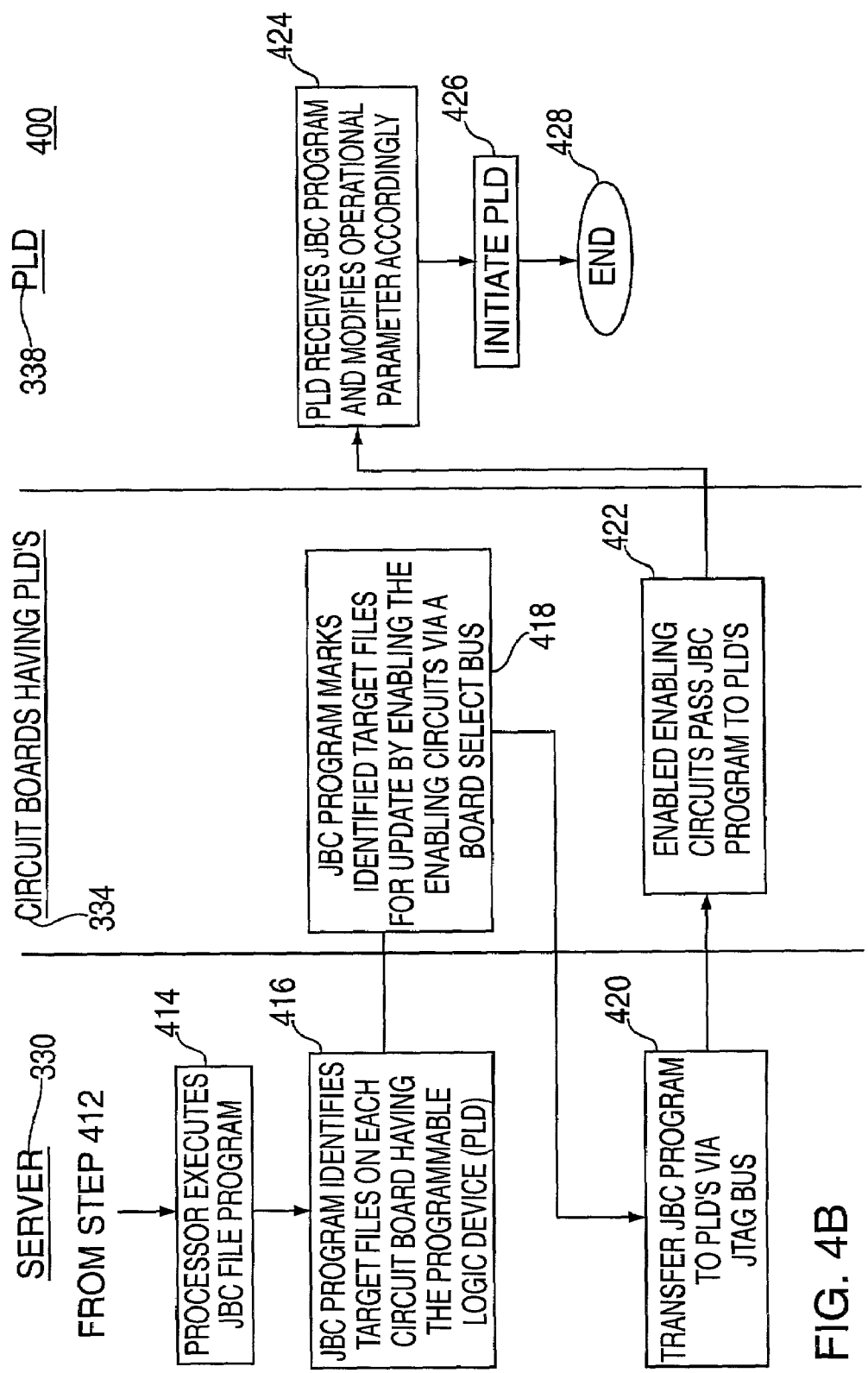

FIGS. 4A and 4B together depict a relational flow diagram 400 between various functional elements of the information processing system 300 of FIG. 3. Generally, the head-end controller 320 receives via a first communications medium 319, a file having a format native to at least one programmable logic device 338. The head-end controller 320 sends the native format file to a processor system (e.g., server or switch) 330 via a second communications medium 321. The processor system 330 executes the native format file to identify and selectively access the at least one programmable logic device 338 via a first bus 340, and then programs the selectively accessed programmable logic devices 338 via a second bus 342.

In particular, the flow chart depicts a sequence of events, which are utilized to program a programmable logic device (PDL) such as the ROM in a field programmable gate array. The method 400 begins in step 402 where a programmer generates a programmer object file (POF) on a remotely located workstation or personal computer. The POF is a compiled binary file. In step 404, a software conversion program (e.g., JAM file conversion software) having the capability to convert the POF into a file containing JAM byte code (JBC) is initiated by the programmer at the remote computer. The JAM conversion software is an executable program specific for a particular type of programmable logic device, which builds target files from source files (e.g., POF) by utilizing specific dependency and build specification rules. Specifically, the JAM software identifies target files, examines a file system to determine those targets requiring an update, and issues operating system (OS) commands to update such target files.

In step 406, the programmer transfers the JBC file to the head-end controller via a first communications path. The first communications path may be a telecommunications medium such as such as the internet or any LAN/WAN networking channel. Alternately, the JBC file may be stored in a physical medium 332, such as tape, CD-ROM, and the like.

In step 408, the head-end controller recieves the JBC file and in step 410 the head-end controller transfers the JBC file to the server (or switch) for execution via a second communications path, (e.g., Ethernet). In step 412, the server recieves the JBC file and the method 400 proceeds to step 414.

In step 414, the processor (e.g., a plurality of processors arranged in a parallel) executes the JBC file to run the JBC program. In step 416, the JBC program identifies target files on each of the circuit boards having the programmable logic device (PDL). In particular, the JBC program is transferred over the board select bus, which is a parallel bus between the processor, and each circuit board coupled to the backplane. The executed program initially identifies those programming logic devices on the circuit boards that correspond to the JBC program (e.g., a particular programmable logic device type or family of devices of a specific manufacturer).

In step 418 the JBC program marks the identified target files (PDL's) by enabling the switching circuit 336 on the circuit board 334. Specifically, the JBC program marks the PLD target files that require an upgrade (i.e., reprogramming). Once the switching circuit 336 corresponding to the identified target flies are set in an enabling mode, then, in step 420, the JBC program is transferred to the corresponding PLD's 338 requiring an update via the JTAG bus 342. Specifically, in step 422, the switching circuits 336 that have been enabled, transfer the JBC program from the processor board 332, via the JTAG bus 342, to the PLD 338.

In step 424, the particular PLD's marked for an update receive the JBC program, whereupon the program is executed to modify the operational parameters according to the programming initially created by the programmer in the programmer object file (POF). After the PDL has been updated with the programming code from the JBC program, the method proceeds to step 426.

In step 426, the PLD's that were updated must be reinitialized. In particular, the server and corresponding circuit boards having the updated PLD's are rebooted to reinitialize the particular program code of the PLD's, and in step 428, the method 400 ends.

The present invention provides several advantages over the prior art. First, the invention reduces system costs in general. For example, reducing the cost of interfacing with the CPU. That is, the CPU 124 of each board 122 or module including a PLD (i.e., a CPU within PLD host functional element 140 or circuit card 334) may have input/output ports 134 configured in a common way to provide JTAG programming support. Moreover, the actual CPU 124 utilized to provide the programming may illustratively be a low cost CPU or microprocessor system.

In addition, the subject invention allows utilization of existing software to provide remote programming of the PLD devices. That is, the standard file formats used to store and transport PLD programming files is used by the remote source of programming data 110 and the LAN/WAN 112 to couple such programming files to the processor board 122 via the Ethernet port 138. Similarly, the standard JTAG physical layer and associated protocols defined in the IEEE Standard 1149.1 document are utilized to provide local transfer of re-programming information from the processor board 122 to the PLD 142 on the PLD host functional element 140.

Conversion between the respective programming and transport file format and the JTAG programming format is accomplished by a file-to-JTAG conversion program 150. As such, the programmable updates for the PLD devices 142 may be implemented without requiring a technician to manually update the PLD on-site.

Importantly, by utilizing the aforementioned JTAG physical layer and protocol to communicate between the processor board 122 and one or more PLDs 142 within the system 100, it is not necessary to include intelligence, such as a microprocessor, on the PLD host functional elements 140 within the system. In this manner, the decreased use of microprocessors within the system allows for a reduction in system cost.

Finally, it is noted that typical back plane specifications are primarily address controlled and data movement is between boards connected to the back plane. By contrast, a back plane constructed according to the present invention includes JTAG communication signal paths such that interboard or inter-module programming of PLDs 142 within host functional elements 140 within the system 100 is provided. By communicating with a central processing element, such as processor board 122 within the loop server or video switch 120, each of the PLDs 142 within a system 100, including the present invention, may be updated via a common JTAG bus. Moreover, by providing an Ethernet port or other communications port 138, the processor board 122 is able to receive, from a remote source of programming data 110, updated programming instructions for the PLDs to be reprogrammed.

Furthermore, one skilled in the art will recognize that these advantages are also applicable to the second embodiment and method as disclosed in FIGS. 3 and 4. Although the embodiments that incorporate the teachings of the present invention has been shown and described in detail herein, those skilled in the art can readily devise many other varied embodiments that still incorporate these teachings.

What is claimed is:

1. A method for programming at least one programmable logic device in a video switch, said video switch capable of transferring video information between a video server and subscriber equipment of a television program delivery system, said method comprising:
    programming a first file, in a non-native format for programming said at least one programmable logic device, at a remote programmer source;
    converting said non-native format programmable logic instructions into a second file having programmable logic instructions in a format native to said at least one programmable logic device;
    transferring said second file to a head-end controller at a cable head-end of said television program delivery system;
    transferring said second file from said head-end controller to said video switch comprising a processor board coupled to a plurality of functional elements, each functional element comprising a programmable logic device coupled to a switching circuit;
    executing said converted file, for identifying particular target files associated with said programmable logic devices, via a first bus coupled to said switching circuits;
    enabling the switching circuit corresponding to each programmable logic device having said identified target files via said first bus; and
    programming said identified programmable logic devices via a second bus coupled to said switching circuit.

2. The method of claim 1 wherein said first file is a programmer object file (POF).

3. The method of claim 1 wherein said remote programmer source is selected from the group comprising a workstation, and a personal computer.

4. The method of claim 1 wherein said second file is a JAM byte code file.

5. The method of claim 1, wherein said communications medium is an Ethernet network.

6. The method of claim 1, wherein said native format comprises a JTAG format.

7. The method of claim 1, wherein said first bus is a board select bus.

8. The method of claim 1, wherein said second bus is a JTAG bus.

9. The method of claim 1 further comprising the step of causing said programmable logic device to enter an initial operating state.

10. The method of claim 1 wherein said executing step is via a parallel bus.

11. The method of claim 1 wherein said programming step is via a serial bus.

12. A video switch capable of programming programmable logic devices and transferring video information between a video server and subscriber equipment of a television program delivery system, said video switch comprising:
    a plurality of circuit boards, each comprising a programmable logic device coupled to a switching circuit;
    a processor system coupled to said switching circuits on said plurality of circuit boards via a board select bus and a JTAG bus, said processor system for receiving, from a head-end controller at a cable head-end of said television program delivery system, a file in a format native to said programmable logic devices; and
    wherein said processor system executes said file in a format native to said programmable logic devices, and identifies particular target files associated with said programmable logic devices and selectively enables a particular switching circuit corresponding to each programmable logic device having said target files via the board select bus for programming said associated programmable logic devices via said JAG bus.

13. The apparatus of claim 12 wherein said first and second bus is a backplane.

14. The apparatus of claim 12 wherein said format native to said remote programmable logic device is a JTAG format.

15. The apparatus of claim 12 wherein said format native file is a JAM byte code file.

16. The apparatus of claim 12 wherein said at least one programmable logic device is selected from the group comprising a gate array, field programmable gate array, programmable, field programmable logic array, read only memory, programmed array logic, programmable logic array, and complex programmable logic devices.

17. The apparatus of claim 12 wherein processor system is a server.

18. The apparatus of claim 12 wherein processor system is a switch.

* * * * *

UNITED STATES PATENT AND TRADEMARK OFFICE
CERTIFICATE OF CORRECTION

PATENT NO. : 7,155,711 B2  Page 1 of 1
APPLICATION NO. : 09/733402
DATED : December 26, 2006
INVENTOR(S) : Stephen R. Vogel et al.

It is certified that error appears in the above-identified patent and that said Letters Patent is hereby corrected as shown below:

Title Page;
    Item 56, References cited, U.S. PATENT DOCUMENTS, Page 2, column 1: line 8, after "6,389,321" delete "B1" and insert instead --B2--; line 10, after "6,496,969" delete "B1" and insert instead --B2--; line 10, delete "Roy" and insert instead --Feng--; line 12, after "6,578,198" delete "B1" and insert instead --B2--; line 14, after "6,718,407" delete "B1" and insert instead --B2--.
    Item 56, References cited, OTHER PUBLICATIONS, Page 2, column 2: line 2, delete "Indusry's" and insert instead --Industry's--; line 2, delete "mlti" and insert instead --multi--.
    Column 1, line 10, delete "60/170,199,filed" and insert instead --60/170,199, filed--; delete "1999,which" and insert instead --1999, which--.
    Column 2, line 65, after "i.e." insert --,--.
    Column 4, line 63, delete "09/540,178,entitled" and insert instead --09/540,178, entitled--.
    Column 6, line 32, delete "internet" and insert instead --internet--.
    Column 6, line 36, delete "recieves" and insert instead --receives--.
    Column 6, line 40, delete "recieves" and insert instead --receives--.
    Column 6, line 58, delete "flies" and insert instead --files--.
    Column 9, line 6, in claim 12, delete "JAG" and insert instead --JTAG--.

Signed and Sealed this

Twenty-eighth Day of August, 2007

JON W. DUDAS
*Director of the United States Patent and Trademark Office*